United States Patent [19]

Gray

[11] Patent Number: 4,988,868
[45] Date of Patent: Jan. 29, 1991

[54] ION DETECTOR

[75] Inventor: John W. Gray, Ware, Mass.

[73] Assignee: Galileo Electro-Optics Corp., Sturbridge, Mass.

[21] Appl. No.: 351,824

[22] Filed: May 15, 1989

[51] Int. Cl.⁵ .......................................... H01J 43/12
[52] U.S. Cl. .................................. 250/281; 250/397; 313/105 R; 313/103 CM; 313/105 CM
[58] Field of Search ............... 250/288, 281, 207, 366, 250/397; 313/105 R, 103 CM, 105 CM

[56] References Cited

U.S. PATENT DOCUMENTS

| | | |
|---|---|---|
| 3,898,456 | 8/1975 | Dietz .................................. 250/281 |
| 3,955,084 | 5/1976 | Griffin .................................. 250/281 |
| 4,188,560 | 2/1980 | Swingler ........................ 313/105 R |
| 4,217,489 | 8/1980 | Rosier .................................. 250/207 |
| 4,240,007 | 12/1980 | Dreyfus et al. ............. 313/105 CM |
| 4,320,295 | 3/1982 | Eloy .................................. 250/281 |
| 4,423,324 | 12/1983 | Stafford . |
| 4,731,538 | 3/1988 | Gray .................................. 250/397 |
| 4,785,172 | 11/1988 | Kubena et al. ...................... 250/288 |
| 4,791,300 | 12/1988 | Yin .................................. 250/366 |
| 4,814,599 | 3/1989 | Wang ......................... 313/103 CM |
| 4,835,383 | 5/1989 | Mahoney et al. .................. 250/281 |

Primary Examiner—Jack I. Berman
Assistant Examiner—Kiet T. Nguyen

[57] ABSTRACT

An ion detector in which conversion dynode means are placed near a microchannel plate means for receiving and amplifying converted ions.

6 Claims, 1 Drawing Sheet

ION DETECTOR

FIELD OF THE INVENTION

This invention relates to ion detectors, useful in mass spectrometers.

BACKGROUND OF THE INVENTION

An ion detector that converts negative ions into positive ions or positive ions into electrons and then multiplies and senses the result is shown in Stafford U.S. Pat. No. 4,423,324, "Apparatus for Detecting Negative Ions", granted Dec. 27, 1983, and hereby incorporated herein by reference.

SUMMARY OF THE INVENTION

An ion detector is provided in which conversion dynode means are placed near microchannel plate ("MCP") means for receiving and amplifying converted ions.

In preferred embodiments, the MCP means is annular and consists of two MCP's arranged in the chevron manner, the conversion dynode means is a bullet-shaped element extending through the hole in the MCP means, and an anode collects the output from the MCP means.

PREFERRED EMBODIMENT

The presently preferred embodiments are as follows.

DRAWING

STRUCTURE

Figure 1:
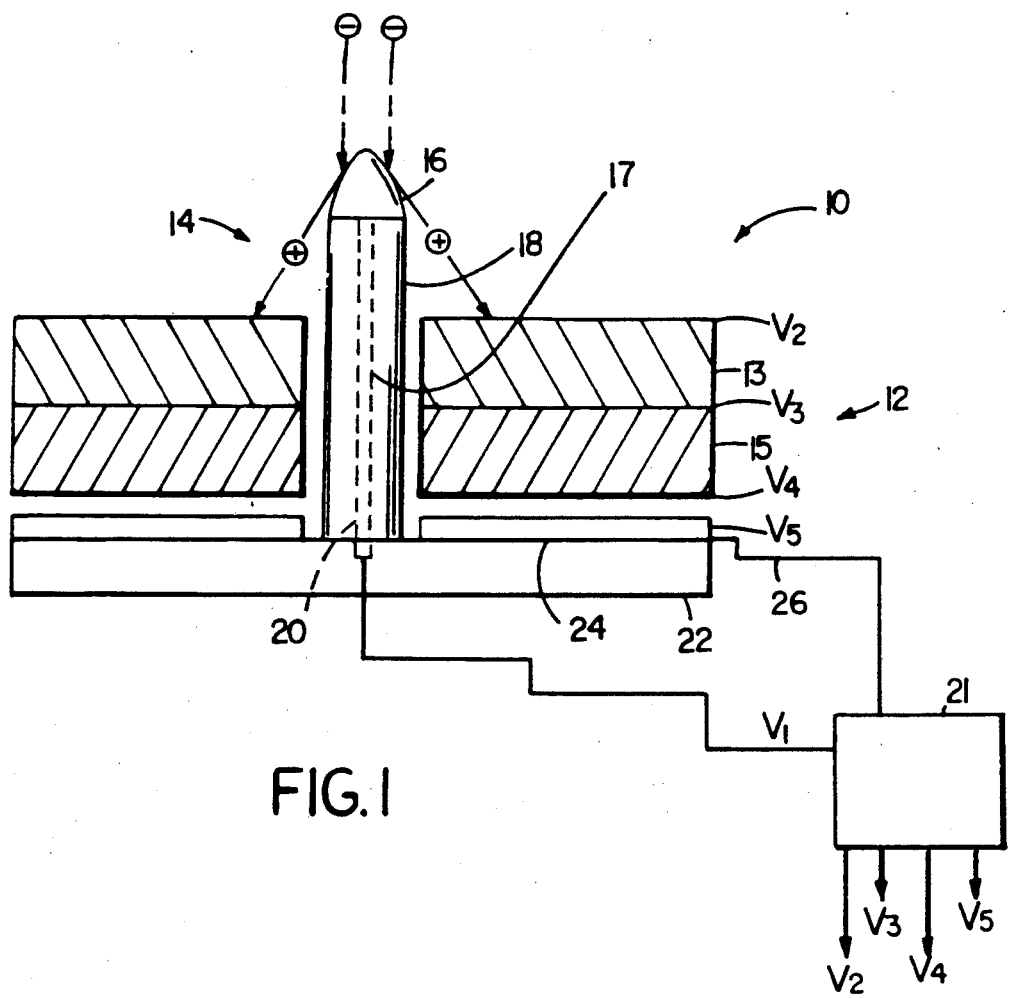
FIG. 1 is a diagrammatic view of the presently preferred embodiment.
Figure 2:
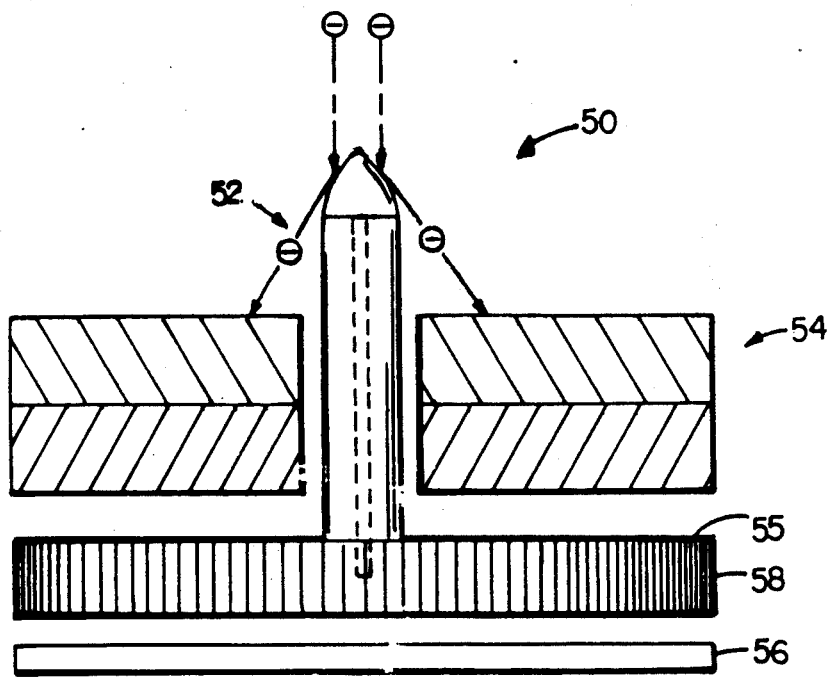
FIG. 2 is a corresponding view of the presently preferred alternative embodiment.

Referring to FIG. 1, ion detector 10 includes MCP means indicated generally at 12, and which includes chevronoriented MCP's 13 and 15, and conversion dynode means indicated generally at 14, passing through aligned holes (constructed by drilling through glass core 17) in MCP's 13 and 15, and formed of a stainless-steel (300 series) bullet-shaped tip 16 and an insulative portion (aluminum oxide type ceramic) 18 mounted on a ceramic insulating base 22. Conductor 20 joins tip 16 to circuitry control 21 at V1; control 21 sets the voltage at the input to MCP 13 at V2, between MCP 13 and MCP 15 at V3, at the output of MCP 15 at V4, and at anode collector 24 at V5.

OPERATION

To detect negative ions, as in FIG. 1, V1 is set in the preferred embodiment at 5 Kv, causing emission from tip 16 of positive ions detected by applying V2 of −2 Kv, V3 of −1 KV, V4 at ground, and V5 of +200 volts.

The central position of the conversion dynode means in the MCP means provides for symmetrical output, and the pointed tip of the former provides concentration of electric field.

For detecting positive ions, V1 is set at −7 Kv, to produce secondary electrons detected using V2 at −2.2 Kv, V3 at −1.2 Kv, V4 at −200 V, and V5 at ground.

OTHER EMBODIMENTS

The MCP means 54 output detector 50 may be rather than an anode a phosphor screen 55 coupled by fiber optics 58 to a photodiode array 56.

The conversion dynode 14 may be divided by insulation into portions, annular, sectors, or other, of different polarity of charge, for detection, with properly adjusted and cooperating MCP and collector means of both positive and negative ions at the same time.

The entire conversion means 14 may be conducting.

What is claimed is:

1. An ion detector comprising:
conversion dynode means,
MCP means having an inlet surface of a first area, and collector means,
    said conversion dynode means being positioned center the inlet of said MCP means and having an emitting surface with a projected area in a plane corresponding with a projected area of said inlet surface that is less than said first area, said conversion dynode means receiving charged particles on and directly emitting charged particles from said emitting surface, and
    said collector means being positioned near the outlet of said MCP means,
    whereby ions are converted at said emitting surface of said conversion dynode means and the charged particles emitted therefrom are received by and amplified in said MCP means and collected in said collector means.

2. The detector of claim 1 in which said MCP means is annular and said conversion dynode means extends therethrough.

3. The detector of claim 2 in which said MCP means includes two MCP's in chevron relation.

4. The detector of claim 2 in which said conversion dynode means includes an end with axial cross-section diminishing in an axial direction away from said collector means.

5. The detector of claim 4 in which said end has a bullet shape.

6. The detector of claim 4 in which said end is metallic and a portion of said dynode is insulative.

* * * * *